(12) United States Patent
Lin et al.

(10) Patent No.: US 8,269,278 B2
(45) Date of Patent: Sep. 18, 2012

(54) SEMICONDUCTOR DEVICE WITH π-SHAPED SEMICONDUCTOR CONDUCTIVE LAYER AND METHOD FOR MAKING THE SAME

(75) Inventors: Jyi-Tsong Lin, Kaohsiung (TW);
Yi-Chuen Eng, Kaohsiung (TW);
Po-Hsieh Lin, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 268 days.

(21) Appl. No.: 12/437,361

(22) Filed: May 7, 2009

(65) Prior Publication Data
US 2010/0117151 A1    May 13, 2010

(30) Foreign Application Priority Data
Nov. 10, 2008    (TW) .............................. 97143370 A

(51) Int. Cl.
*H01L 27/12* (2006.01)

(52) U.S. Cl. ................ 257/347; 257/E29.286; 438/149; 438/479; 438/517

(58) Field of Classification Search .................... 257/347
See application file for complete search history.

(56) References Cited

U.S. PATENT DOCUMENTS
2008/0251843 A1 * 10/2008 Nakajima ..................... 257/347
* cited by examiner

*Primary Examiner* — Ajay K Arora
(74) *Attorney, Agent, or Firm* — WPAT, P.C.; Anthony King

(57) ABSTRACT

The semiconductor device with a π-shaped semiconductor conductive layer manufactured by the manufacturing method thereof utilizes two pathways of the π-shaped semiconductor conductive layer connected to the silicon layer of a silicon-on-insulator (SOI) substrate for heat dissipation, so as to reduce the self-heating effects (SHEs). Furthermore, the semiconductor device of the invention utilizes the self-aligned technique to form a self-aligned structure with a gate unit and the silicon layer, so that the process is simple, the production cost is reduced, the compacted ability and the yield are improved, the off current and short-channel effects (SCEs) are still similar to a conventional UTSOI MOSFET, and the stability and the reliability are therefore superior.

11 Claims, 18 Drawing Sheets

SEMICONDUCTOR DEVICE WITH π-SHAPED SEMICONDUCTOR CONDUCTIVE LAYER AND METHOD FOR MAKING THE SAME

BACKGROUND OF THE INVENTION

1. Field of the Invention

The present invention relates to a semiconductor device and a method for manufacturing the same, and more particularly to a semiconductor device with a π-shaped semiconductor conductive layer and a method for manufacturing the same.

2. Description of the Related Art

In order to achieve high integration density, high speed, and low cost, conventional metal-oxide-semiconductor field-effect transistors (MOSFETs) have entered the nano-era. However, the conventional MOSFETs may encounter serious short-channel effects (SCEs), such as the so-called threshold voltage roll-off phenomenon and drain-induced barrier lowering (DIBL) effects. In addition, a conventional bulk complementary metal oxide semiconductor (CMOS) also has problems including excessive PN junction parasitic capacitance and serious leakage current.

A silicon-on-insulator (SOI) technique seems to alleviate all the problems of the conventional bulk CMOS. However, the conventional SOI faces the problems of serious floating-body effects (FBEs) and poor heat dissipation. If better element subthreshold characteristics are to be obtained, the thickness of the main body of the conventional SOI must be further reduced, which will result in more serious self-heating effects (SHEs) and greatly lower the heat stability of the element, and the uneven thinness of the silicon film corresponding to the series resistance and the threshold voltage seriously will affect the element performance. In addition, an improved MOSFET manufactured by utilizing a non self-aligned technique defines a silicon main body and a gate by using a plurality of masks, which makes it difficult to keep the compact size or achieve mass production.

Therefore, it is necessary to provide a semiconductor device with a π-shaped semiconductor conductive layer and a method for manufacturing the same, so as to solve the above problems.

SUMMARY OF THE INVENTION

The present invention is directed to a semiconductor device with a π-shaped semiconductor conductive layer, which includes an SOI substrate, a gate unit, a spacing layer, a second silicon layer, a second insulating barrier layer, a source, and a drain. The SOI substrate has a silicon substrate, a first insulating barrier layer, and a first silicon layer, the first insulating barrier layer being located on the silicon substrate, and the first silicon layer being located on the first insulating barrier layer. The gate unit is located on the first silicon layer. The spacing layer covers the gate unit. The second silicon layer covers the silicon substrate and opposite positions of two opposite sides of the first insulating barrier layer and the first silicon layer. The second insulating barrier layer is located on the second silicon layer, and spaced from the second silicon layer and located on the two opposite lateral edges of the first insulating barrier layer. The source and the drain are formed on the second insulating barrier layer and connected to the first silicon layer through the second silicon layer, and the source, the drain, the first silicon layer, and the second silicon layer form the π-shaped semiconductor conductive layer.

The present invention is further directed to a method for manufacturing a semiconductor device with a π-shaped semiconductor conductive layer which includes the following steps. (a) An SOI substrate is provided, and the SOI sequentially has a silicon substrate, a first insulating barrier layer, and a first silicon layer. (b) A gate unit is formed on the first silicon layer. (c) A spacing layer is formed to cover the gate unit. (d) A part of the first silicon layer and a part of the first insulating barrier layer are removed according to a total width of the spacing layer and the gate unit. (e) A second silicon layer is formed to cover the spacing layer, the first silicon layer, the first insulating barrier layer, and the silicon substrate. (f) A second insulating barrier layer is formed on the second silicon layer, and the second insulating barrier layer is located at opposite positions on two opposite lateral edges of the first insulating barrier layer. (g) A third silicon layer is formed to cover the second insulating barrier layer and the second silicon layer. (h) A part of the second silicon layer and a part of the third silicon layer are removed, so as to expose the spacing layer. (i) A source and a drain are formed on the second insulating barrier layer, the source and the drain being connected to the first silicon layer, and the source, the drain, the first silicon layer, and the second silicon layer form the π-shaped semiconductor conductive layer.

The present invention provides a non-conventional SOI MOSFET having a self-aligned technique, a high quality monocrystalline silicon channel layer (the first silicon layer), and π-shaped semiconductor conductive layer. The structure and the technique of the semiconductor device of the present invention may be applied to a thin film transistor (TFT) in the photoelectric field, and are quite helpful in the manufacture of nano-elements, particularly elements under 10 nanometers.

The semiconductor device of the present invention is a brand-new ultrathin SOI (UTSOI) field effect transistor with good compact capability and extremely high flexibility in terms of expansion and modification of the element performance. Moreover, in the present invention, interference of impurity concentration variability with the element performance is wholly eliminated by utilizing the undoped intrinsic first silicon layer, and the design of the threshold voltage is optimized with gate engineering.

The semiconductor device with the π-shaped semiconductor conductive layer manufactured with the manufacturing method of the present invention has two heat dissipation pathways connected to the first silicon layer, thereby reducing the SHEs of the semiconductor device. Furthermore, the semiconductor device with the π-shaped semiconductor conductive layer utilizes the self-aligned technique to generate a self-aligned structure with the gate unit and the silicon layer, so the process is simple, the cost is reduced, the element compact ability, the yield, leakage current and the SCEs are improved, and the stability and the reliability are therefore superior.

Further, the semiconductor device with the π-shaped semiconductor conductive layer of the present invention has a lower resistance from the source to the drain, a higher on current, a higher electron velocity, a lower lattice temperature, and a higher transconductance, so the its performance on the whole is much better than the performance of the conventional MOSFET.

DETAILED DESCRIPTION OF THE INVENTION

Figure 1:
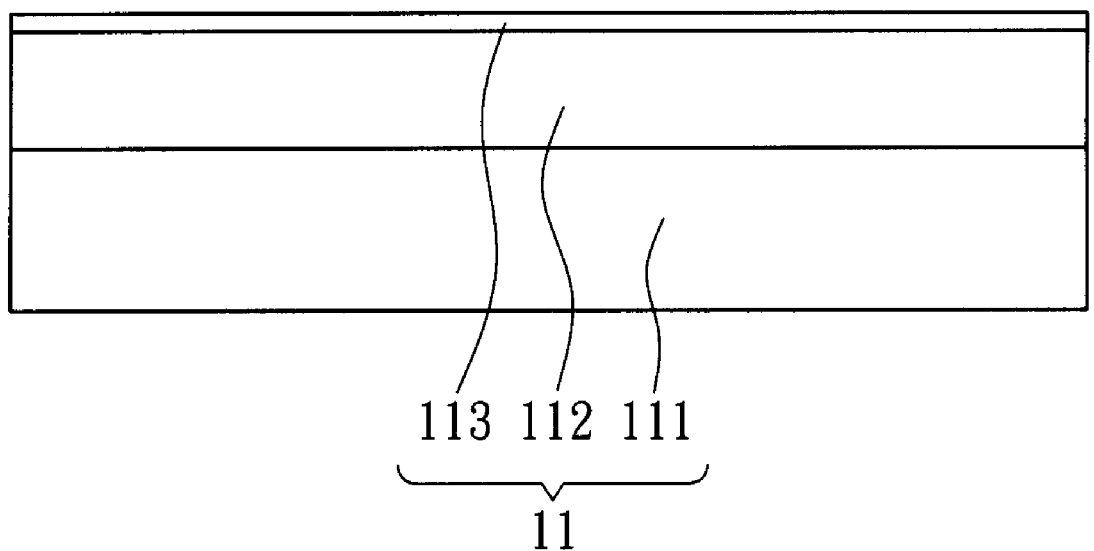
FIGS. 1 to 13 are schematic views of a method for manufacturing a semiconductor device with a π-shaped semiconductor conductive layer according to the present invention.
Figure 2:
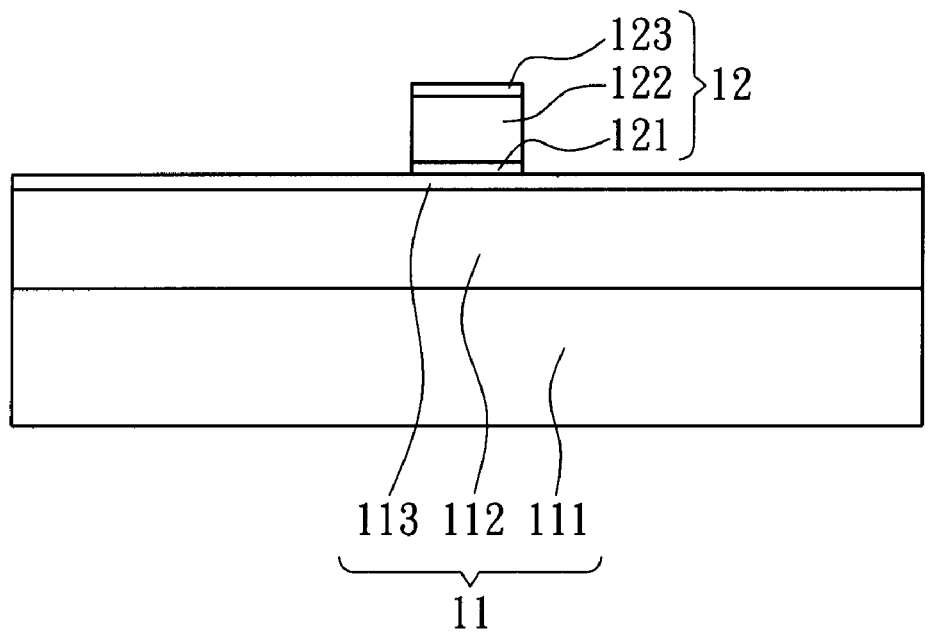
Figure 3:
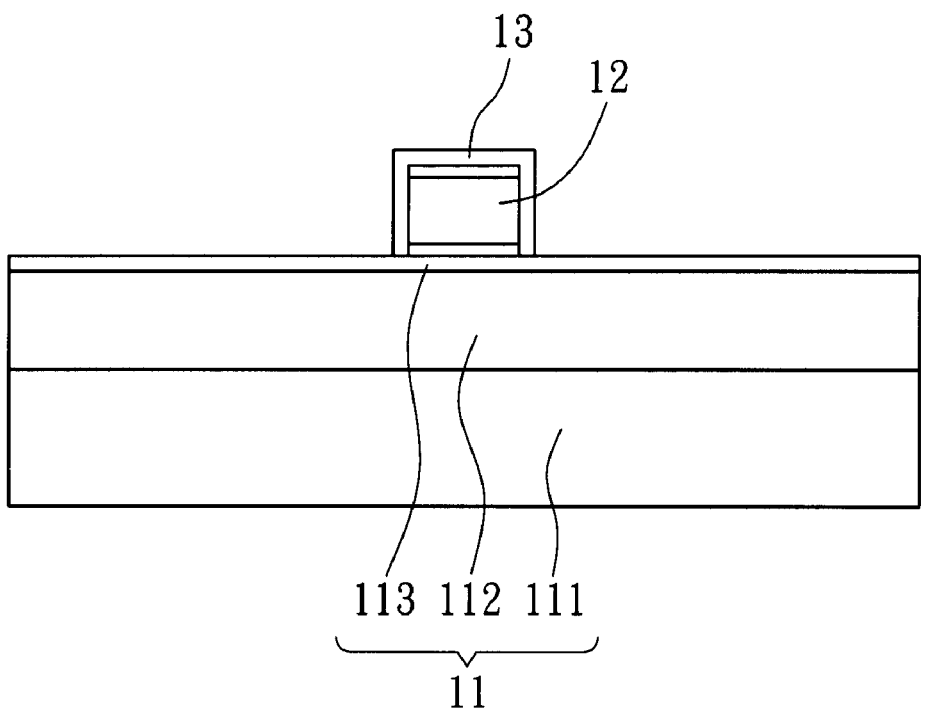

FIGS. 1 to 10 are schematic views of a method for manufacturing a semiconductor device with a π-shaped semiconductor conductive layer according to the present invention. As shown in FIG. 1, first an SOI substrate 11 is provided, and the SOI substrate 11 sequentially has a silicon substrate 111, a first insulating barrier layer 112, and a first silicon layer 113. As shown in FIG. 2, a gate unit 12 is formed on the first silicon layer 113. In this embodiment, the gate unit 12 sequentially includes a gate oxide layer 121, a gate 122, and a SiN layer 123, and the gate oxide layer 121 is formed on the first silicon layer 113. As shown in FIG. 3, a spacing layer 13 is formed to cover the gate unit 12.

Figure 4:
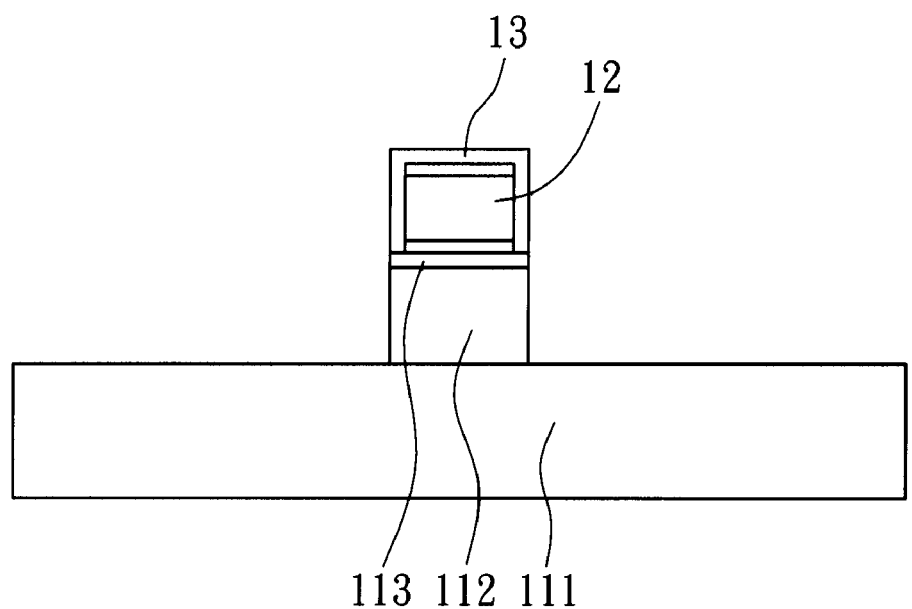

As shown in FIG. 4, a part of the first silicon layer 113 and a part of the first insulating barrier layer 112 are removed according to a total width of the spacing layer 13 and the gate unit 12 (defined as a gate length Lg), so that the remaining part of the first silicon layer 113 and the remaining part of the first insulating barrier layer 112 have the same width as the total width of the spacing layer 13 and the gate unit 12; in other words, a self-aligned structure with a gate and a silicon main body (the first silicon layer 113) is generated by utilizing a self-aligned technique. In this embodiment, a part of the first silicon layer 113 and a part of the first insulating barrier layer 112 are removed by utilizing a hard mask (SiN).

Figure 5:
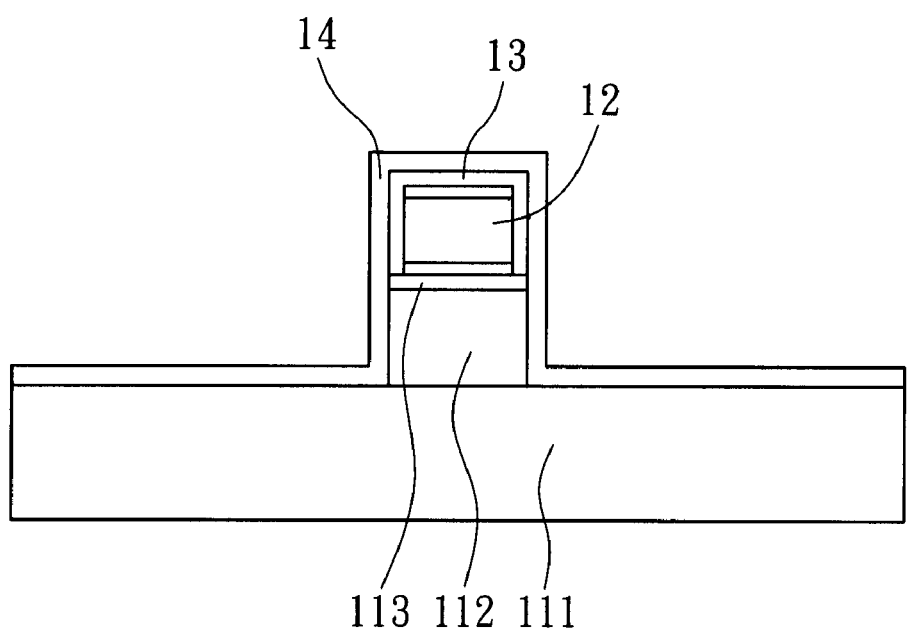

As shown in FIG. 5, a second silicon layer 14 is formed to cover the spacing layer 13, the first silicon layer 113, the first insulating barrier layer 112, and the silicon substrate 111. In this embodiment, the second silicon layer 14 is formed by utilizing a chemical vapor deposition (CVD) method.

Figure 6:
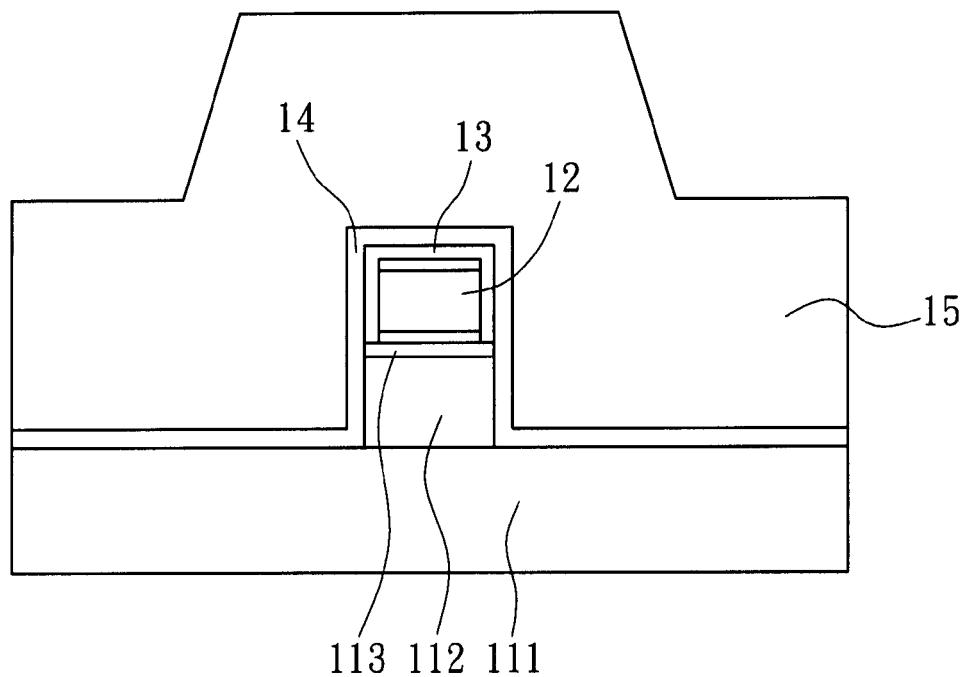
Figure 7:
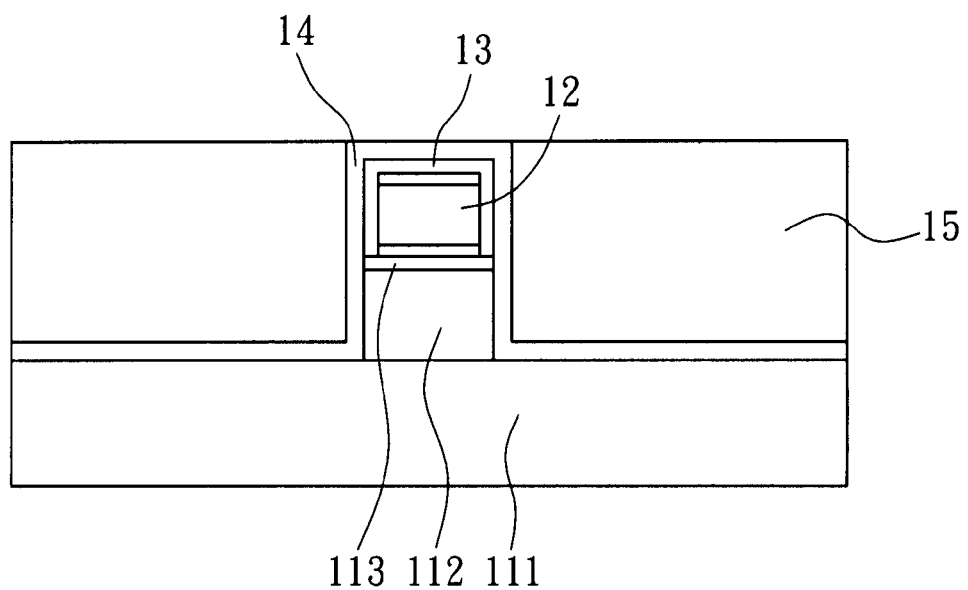
Figure 8A:
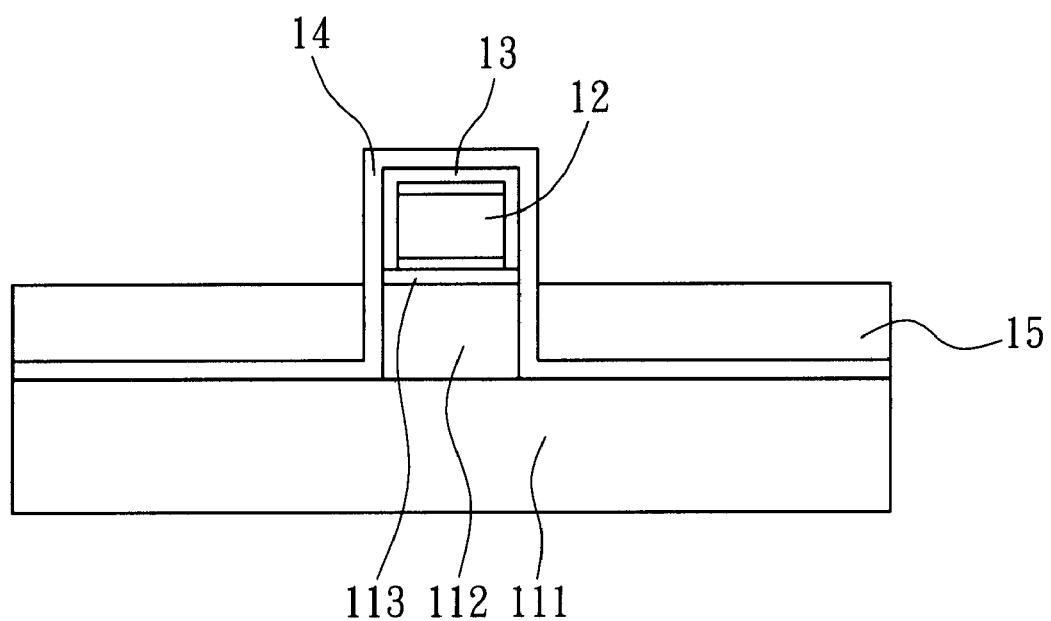

As shown in FIG. 6, a second insulating barrier layer 15 is formed, and the second insulating barrier layer 15 wholly covers the second silicon layer 14. The second insulating barrier layer 15 approximately assumes a stepped bump with respect to the SOI substrate 11. As shown in FIG. 7, a part of the second insulating barrier layer 15 is removed through a chemical mechanical polishing (CMP) method and by using the second silicon layer 14 above the gate unit 12 as a polish stop layer. As shown in FIG. 8A, a part of the second insulating barrier layer 15 is removed by an etching method, so that the second insulating barrier layer 15 is located on the second silicon layer 14 and is located at opposite positions on two opposite lateral edges of the first insulating barrier layer 112, and a height of the second insulating barrier layer 15 is made substantially equal to a height of the first insulating barrier layer 112.

Figure 8B:
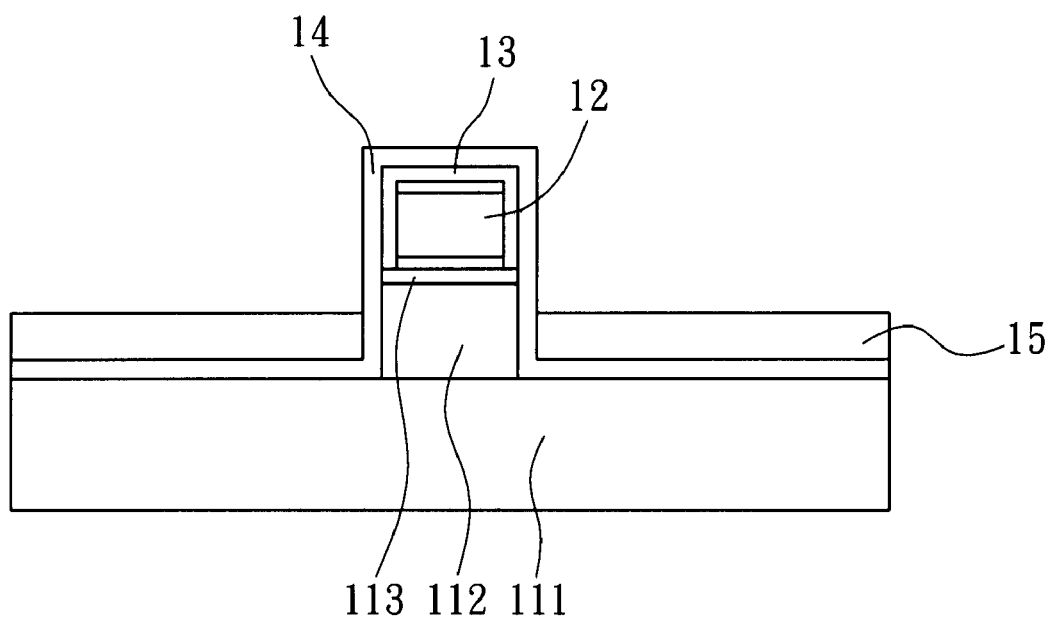

It should be noted that in other applications, after a part of the second insulating barrier layer 15 is removed, the second insulating barrier layer 15 may be made substantially shorter than the first insulating barrier layer 112 (as shown in FIG. 8B).

Figure 9:
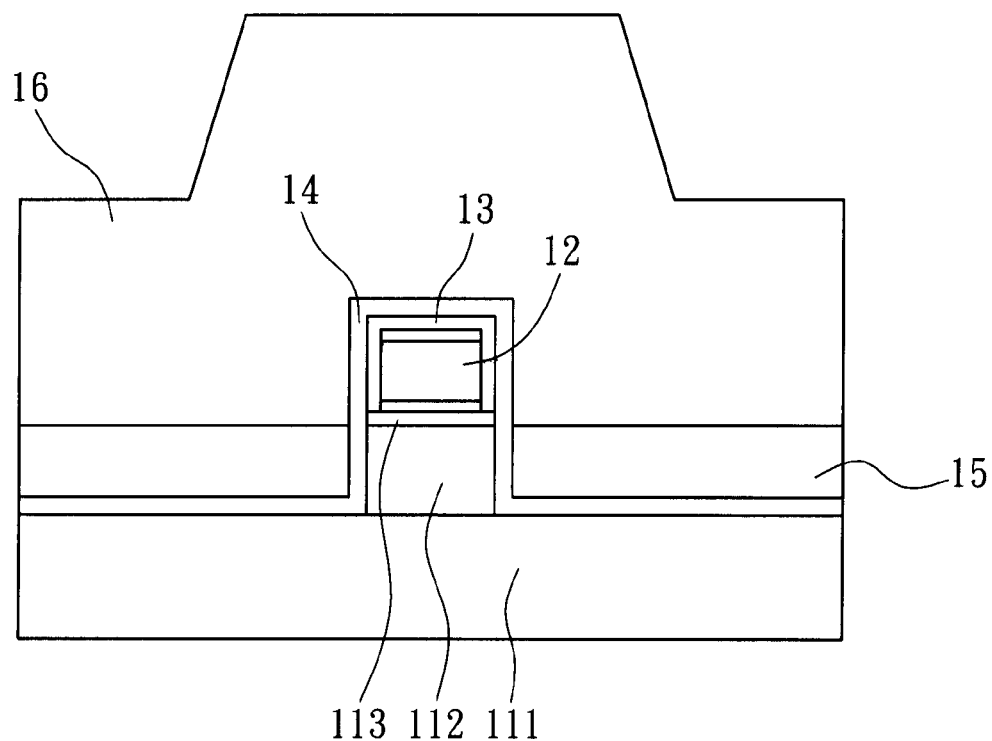

As shown in FIG. 9, a third silicon layer 16 is formed to cover the second insulating barrier layer 15 and the second silicon layer 14. The third silicon layer 16 approximately assumes a stepped bump with respect to the second insulating barrier layer 15. The third silicon layer 16 may be selectively formed by utilizing the CVD method or an epitaxial growth technique. The element performance may be improved by applying other recrystallization techniques, for example, a metal-induced lateral recrystallization (MILR) technique, a laser scan recrystallization (LSR) technique, or a heat treatment recrystallization (HR) technique.

Figure 10:
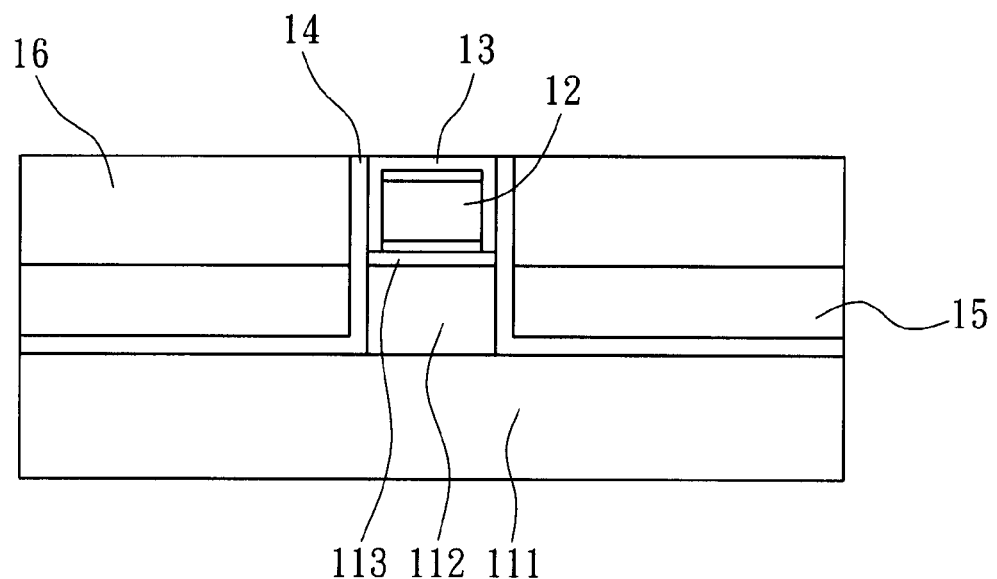
Figure 11:
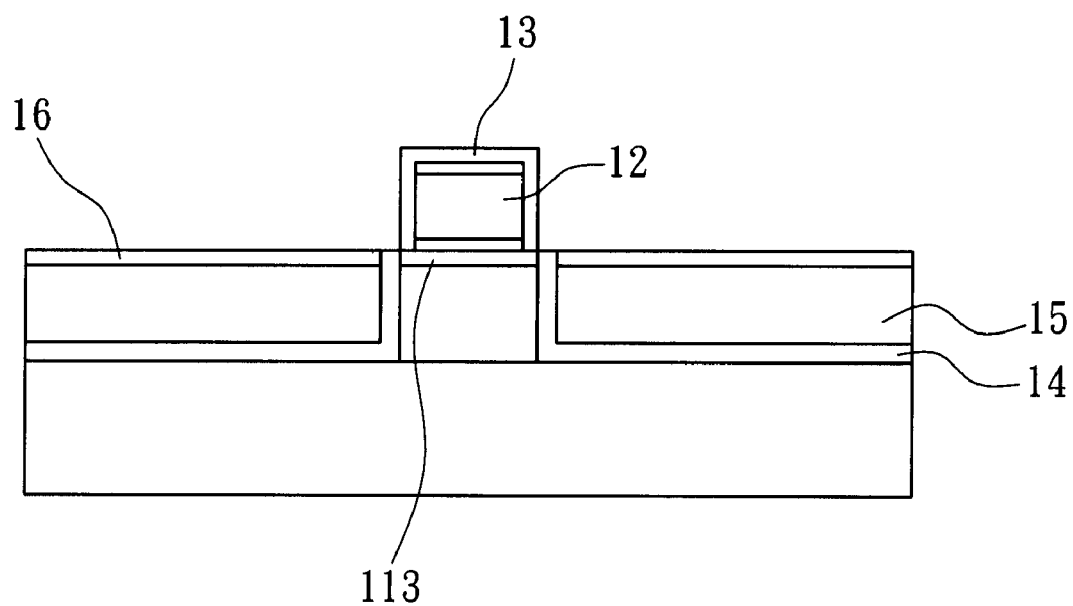
Figure 12:
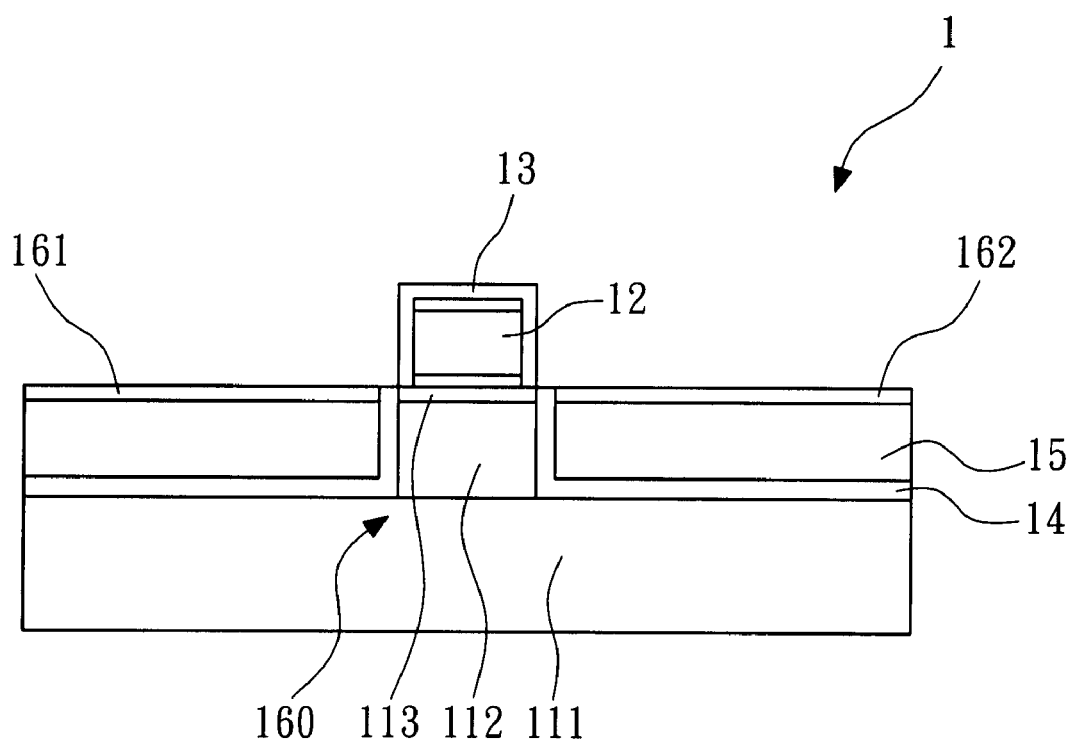

As shown in FIG. 10, a part of the third silicon layer 16 is removed through the CMP method and by using the spacing layer 13 above the gate unit 12 as the polish stop layer. As shown in FIG. 11, a part of the third silicon layer 16 and a part of the second silicon layer 14 are removed by utilizing the etching method, and the remaining part of the third silicon layer 16 is located on the second insulating barrier layer 15 and connected to the first silicon layer 113 through the second silicon layer 14. As shown in FIG. 12, a doping step is performed, so that the third silicon layer 16 forms a source 161 and a drain 162. The source 161, the drain 162, the first silicon layer 113, and the second silicon layer 14 form a π-shaped semiconductor conductive layer 160.

It should be emphasized that no matter whether it is the MILR technique, the LSR technique, or the HR technique that is utilized, if the first silicon layer 113 is a monocrystalline silicon layer, the finally formed π-shaped semiconductor conductive layer 160 will have preferable quality and electrical characteristics.

Figure 13:
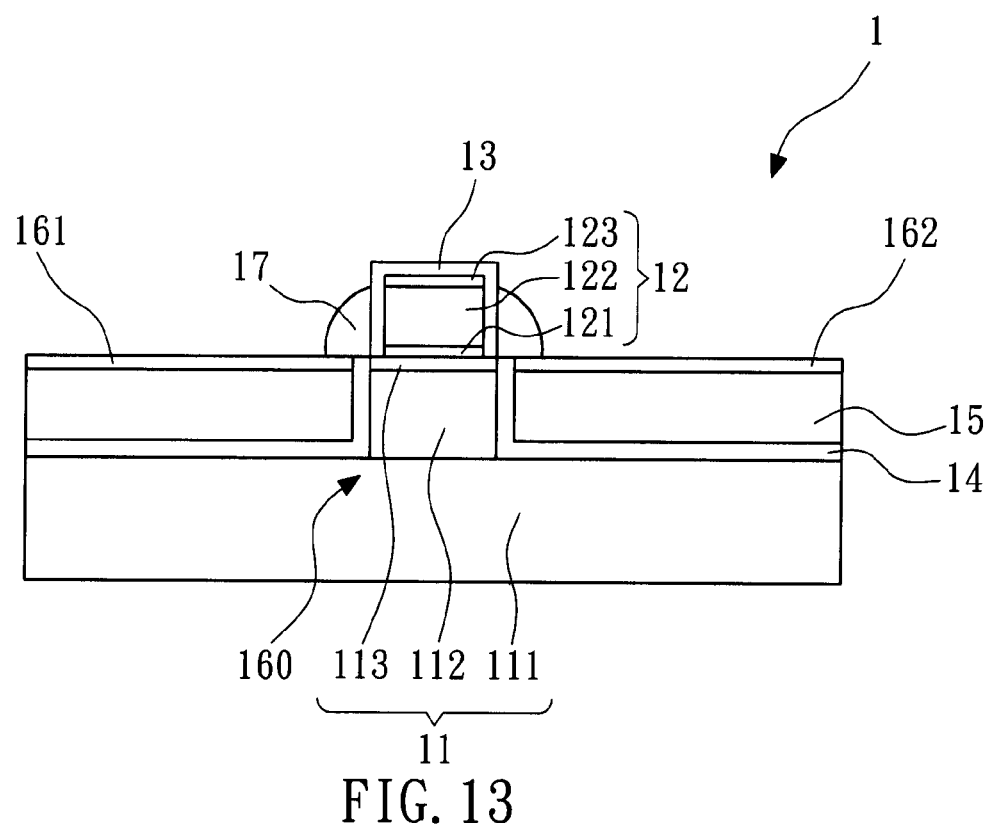

As shown in FIG. 13, a spacer 17 is formed between the source 161 and the spacing layer 13, and between the drain 162 and the spacing layer 13, so as to protect the gate unit 12.

FIG. 13 is a schematic view of a semiconductor device with a π-shaped semiconductor conductive layer according to a first embodiment of the present invention. The semiconductor device 1 with the π-shaped semiconductor conductive layer includes an SOI substrate 11, a gate unit 12, a spacing layer 13, a second silicon layer 14, a second insulating barrier layer 15, a source 161, a drain 162, and a spacer 17. The SOI substrate 111 has a silicon substrate 111, a first insulating barrier layer 112, and a first silicon layer 113, the first insulating barrier layer 112 is located on the silicon substrate 111, and the first silicon layer 113 is located on the first insulating barrier layer 112. The first silicon layer 111 is preferably a monocrystalline silicon layer.

The gate unit 12 is located on the first silicon layer 113. In this embodiment, the gate unit 12 sequentially includes a gate oxide layer 121, a gate 122, and a SiN layer 123, and the gate oxide layer 121 is formed on the first silicon layer 113. The gate oxide layer 121 is selected from silicon dioxide, SiN, oxygen-nitrogen-oxygen, high dielectric coefficient material, or any combination thereof. The gate 122 may be made of a metal material or a polycrystalline silicon material.

The spacing layer 13 covers the gate unit 12. In this embodiment, the spacing layer 13 is a SiN layer. The second silicon layer 14 covers the silicon substrate 111 and the two opposite sides of the first insulating barrier layer 112 and the first silicon layer 113. In this embodiment, the second silicon layer 14 is a polycrystalline silicon layer.

The second insulating barrier layer 15 is located on the second silicon layer 14, and is spaced by the second silicon layer 14 to be located at opposite positions on the two opposite lateral edges of the first insulating barrier layer 112. In this embodiment, the height of the second insulating barrier layer 15 is substantially equal to the height of the first insulating barrier layer 112.

The source 161 and the drain 162 are formed on the second insulating barrier layer 15, and are connected to the first silicon layer 113 through the second silicon layer 14. The source 161, the drain 162, the first silicon layer 113, and the second silicon layer 14 form a π-shaped semiconductor conductive layer 160. The spacer 17 is formed between the source 161 and the spacing layer 13, and between the drain 162 and the spacing layer 13, so as to protect the gate unit 12.

Figure 14:
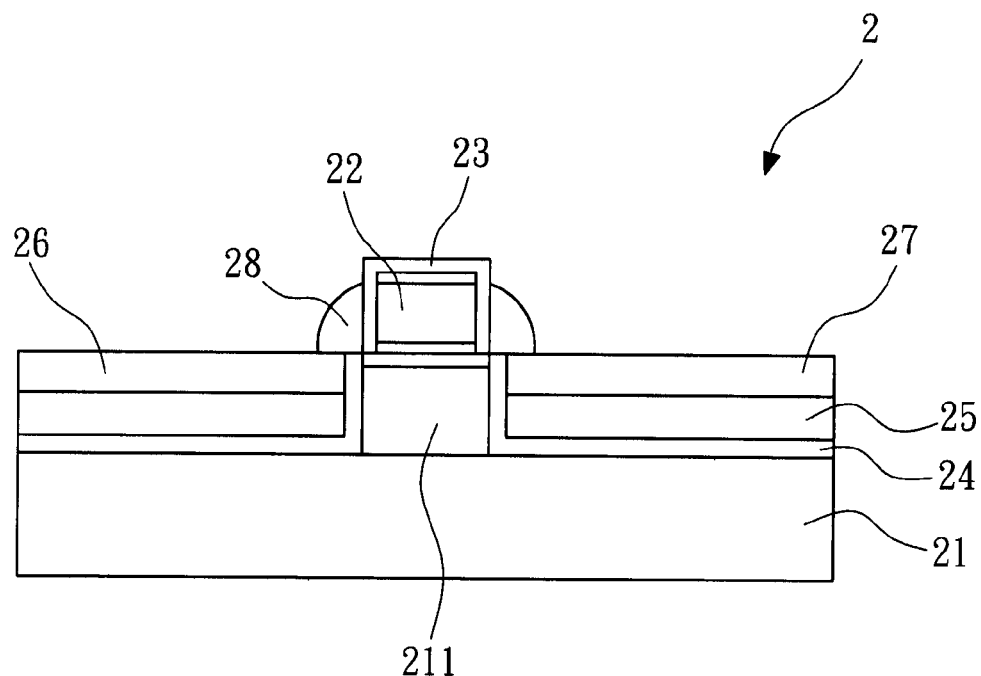
FIG. 14 is a schematic view of the semiconductor device with the π-shaped semiconductor conductive layer according to a second embodiment of the present invention.

FIG. 14 is a schematic view of a semiconductor device with a π-shaped semiconductor conductive layer according to a second embodiment of the present invention. A semiconductor device 2 with a π-shaped semiconductor conductive layer includes an SOI substrate 21, a gate unit 22, a spacing layer 23, a second silicon layer 24, a second insulating barrier layer 25, a source 26, a drain 27, and a spacer 28. The difference between the semiconductor device 2 with the π-shaped semiconductor conductive layer of the second embodiment and the semiconductor device 1 with the π-shaped semiconductor conductive layer of the first embodiment of FIG. 13 is that the second insulating barrier layer 25 of the second embodiment is substantially shorter than the first insulating block layer 211 of the SOI substrate 21 (the source 26 and the drain 27 are relatively thicker than the source 161 and the drain 162 of the semiconductor device 1 of the semiconductor device with the π-shaped semiconductor conductive layer of the first embodiment). The other parts of the semiconductor device 2 with the π-shaped semiconductor conductive layer of the second embodiment is the same as that of the semiconductor device 1 with the π-shaped semiconductor conductive layer of the first embodiment, and will not be repeated here.

Figure 15:
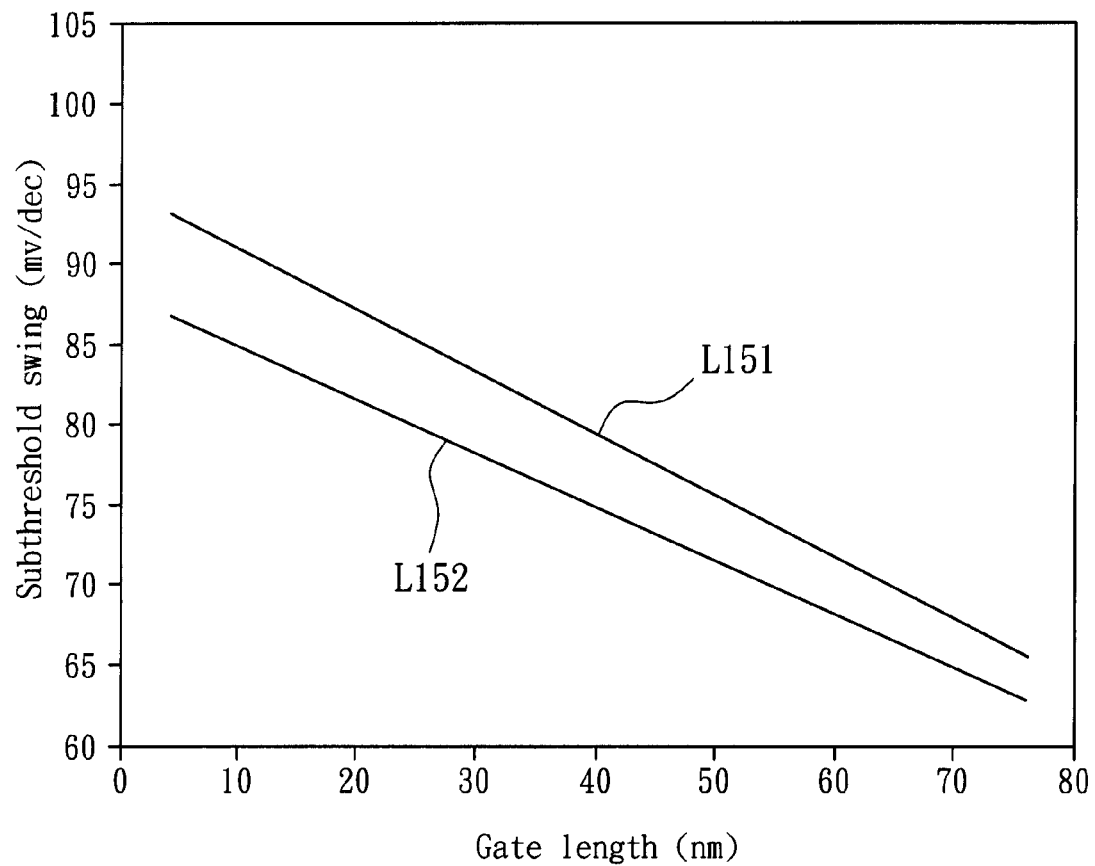
FIG. 15 is a relation diagram of the gate length (Lg) vs. the subthreshold swing of the semiconductor device with the π-shaped semiconductor conductive layer according to the present invention and of a conventional UTSOI transistor.

FIG. 15 is a relation diagram of a gate length (Lg) vs. a subthreshold swing of the semiconductor device with the π-shaped semiconductor conductive layer according to the present invention and a conventional UTSOI transistor when a drain bias is 1.0 V. A curve L151 represents a relation curve of the gate length vs. the subthreshold swing of the semiconductor device with the π-shaped semiconductor conductive layer according to the present invention, and a curve L152 represents a relation curve of the gate length vs. the subthreshold swing of the conventional UTSOI transistor. It can be known by comparing the curve L151 with the curve L152 that the semiconductor device with the π-shaped semiconductor conductive layer according to the present invention has a subthreshold swing similar to that of the conventional UTSOI transistor, that is, the subthreshold swing will not be greatly lowered as in the conventional UTSOI transistor due to the increased heat dissipation pathway.

Figure 16:
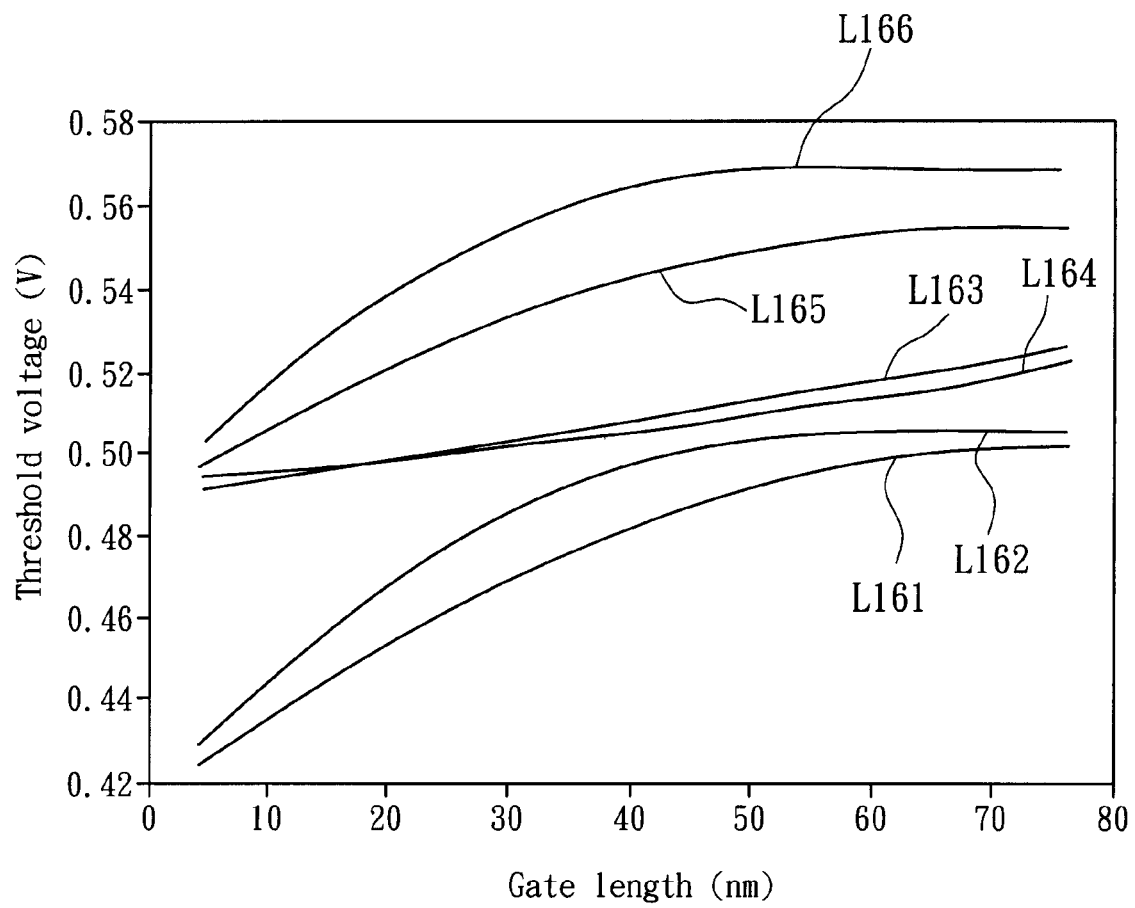
FIG. 16 is a relation diagram of the gate length vs. the threshold voltage of the semiconductor device with the π-shaped semiconductor conductive layer according to the present invention and of the conventional UTSOI transistor.

FIG. 16 is a relation diagram of the gate length vs. a threshold voltage of the semiconductor device with the π-shaped semiconductor conductive layer according to the present invention and the conventional UTSOI transistor. Curves L161 and L162 respectively represent the relation curves of the gate length vs. the threshold voltage of the semiconductor device with the π-shaped semiconductor conductive layer according to the present invention and the conventional UTSOI transistor when the drain bias is 1.0 V and the main body (that is, the first silicon layer) voltage is 0.0 V. Curves L163 and L164 respectively represent the relation curves of the gate length vs. the threshold voltage of the semiconductor device with the π-shaped semiconductor conductive layer according to the present invention and the conventional UTSOI transistor when the drain bias is 0.05 V and the main body voltage is 0.0 V. Curves L165 and L166 respectively represent the relation curves of the gate length vs. the threshold voltage of the semiconductor device with the π-shaped semiconductor conductive layer according to the present invention and the conventional UTSOI transistor when the drain bias is 1.0 V and the main body voltage is −2.0 V. It can be seen from FIG. 16 that under the same drain bias and the same main body voltage, the semiconductor device with the π-shaped semiconductor conductive according to the present has a similar threshold voltage roll-off phenomenon compared to the conventional UTSOI transistor. That is to say, the threshold voltage roll-off phenomenon will not be greatly increased in the new π-shaped UTSOI transistor due to the increased heat dissipation pathway. Under an extremely small drain bias (for example, 0.05 V), the threshold voltage roll-off phenomenon is small and can be neglected.

Figure 17:
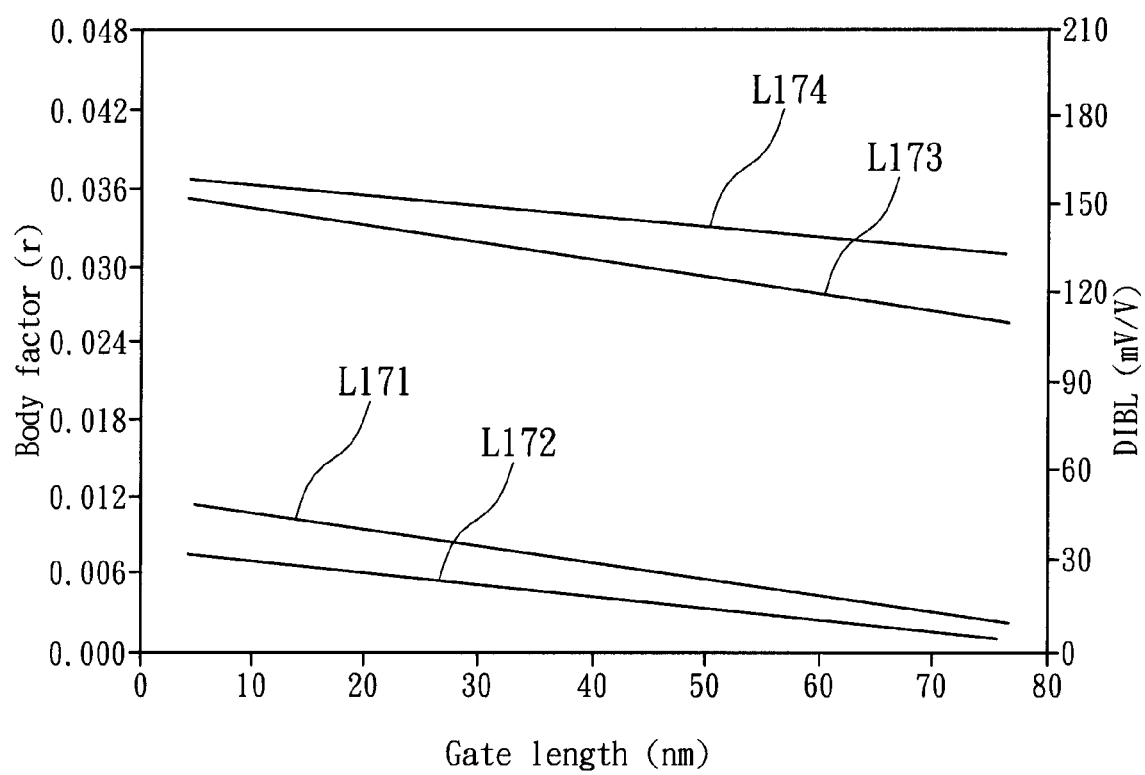
FIG. 17 is a relation diagram of the gate length vs. the DIBL effect and the gate length vs. a body factor of the semiconductor device with the π-shaped semiconductor conductive layer according to the present invention and of the conventional UTSOI transistor.

FIG. 17 is a relation diagram of the gate length vs. a DIBL effect and the gate length vs. a body factor of the semiconductor device with the π-shaped semiconductor conductive layer according to the present invention and the conventional UTSOI transistor, in which the DIBL effect and the body factor are changed according to the gate length. Curves L171 and L172 respectively represent the relation curves of the gate length vs. the DIBL effect of the semiconductor device with the π-shaped semiconductor conductive layer according to the present invention and the conventional UTSOI transistor when the drain bias is 0.05 V and 1.0 V and the main body voltage is 0.0 V. Curves L173 and L174 respectively represent the relation curves of the gate length vs. the body factor of the semiconductor device with the π-shaped semiconductor conductive layer according to the present invention and the conventional UTSOI transistor when the drain bias is 1.0 V and the main body voltage is −2.0 V and 0 V.

A source/drain tie is formed between the second silicon layer and the source, and between the second silicon layer and the drain of the present invention. Therefore, as shown in FIG. 17, under the same drain bias and the same main body voltage, the semiconductor device with the π-shaped semiconductor conductive layer according to the present invention has the DIBL effect similar to that of the conventional UTSOI transistor. Further, the body factor of the semiconductor device with the π-shaped semiconductor conductive layer according to the present invention is smaller than the body factor of the conventional UTSOI transistor. That is to say, the DIBL effect will not be greatly improved as in the conventional UTSOI transistor due to the increased heat dissipation pathway.

Figure 18:
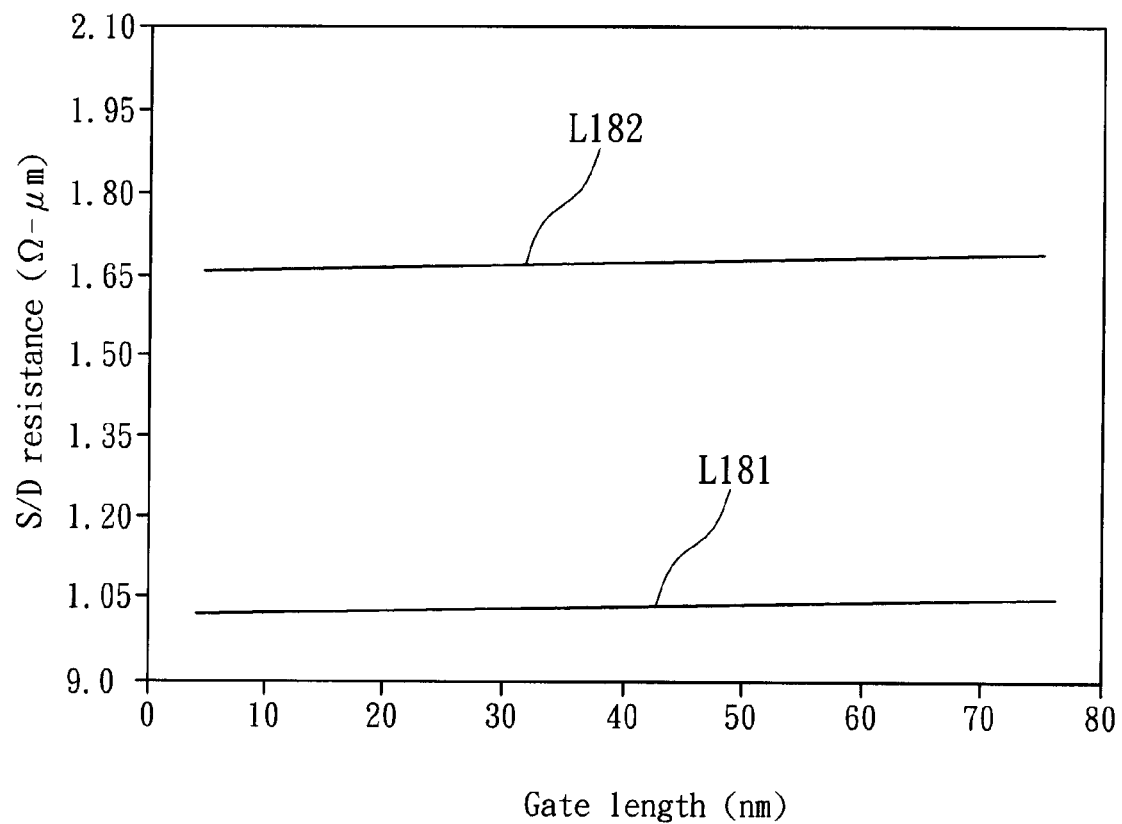
FIG. 18 is a relation diagram of the gate length vs. the resistance from a source to a drain (S/D resistance) of the semiconductor device with the π-shaped semiconductor conductive layer according to the present invention and of the conventional UTSOI transistor.

FIG. 18 is a relation diagram of the gate length vs. a resistance from the source to the drain (S/D resistance) of the semiconductor device with the π-shaped semiconductor conductive layer according to the present invention and the conventional UTSOI transistor. Curves L181 and L182 respectively represent the relation curves of the gate length vs. the resistance from the source to the drain of the semiconductor device with the π-shaped semiconductor conductive layer according to the present invention when the drain bias is 0.05 V and the gate bias is 5.0 V. It can be seen from FIG. 18 that under the same drain bias and the same gate bias, the semiconductor device with the π-shaped semiconductor conductive layer according to the present invention has a lower resistance from the source to the drain.

Figure 19:
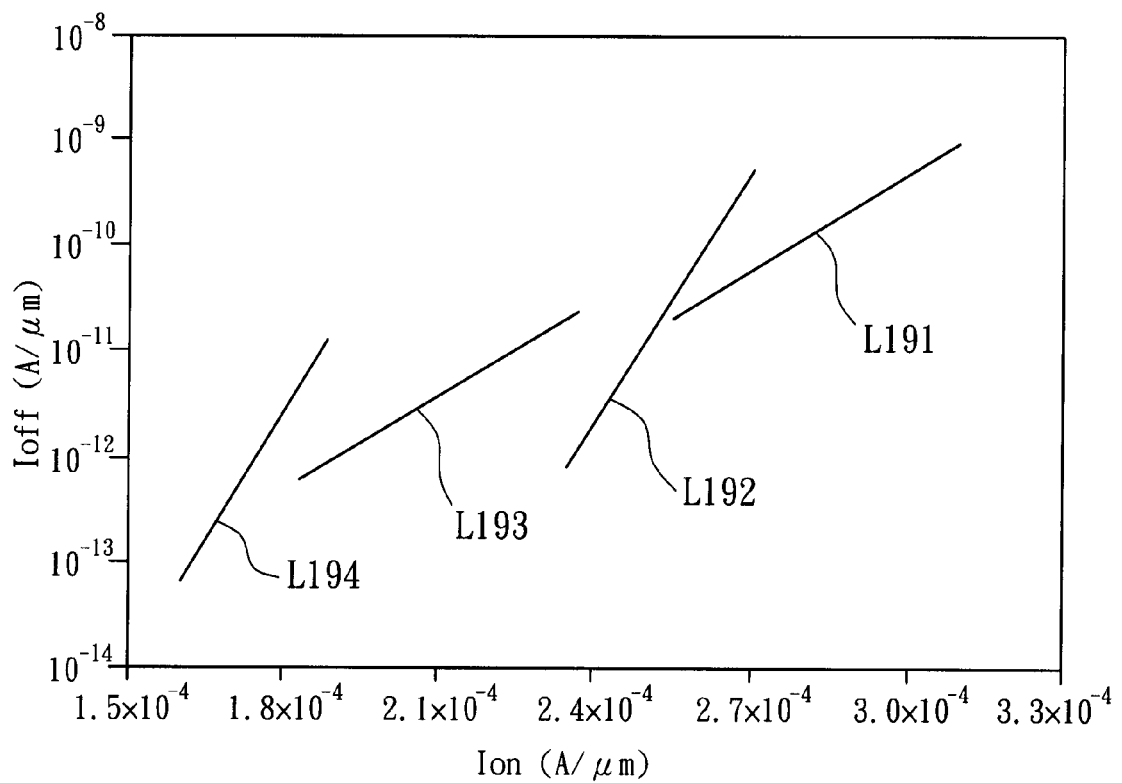
FIGS. 19 and 20 are relation diagrams of an on current ($I_{on}$) vs. the off current (leakage current, $I_{off}$) of the semiconductor device with the π-shaped semiconductor conductive layer according to the present invention when a drain bias is 1.0 V.

FIG. 19 is a relation diagram of an on current ($I_{on}$) vs. an off current (leakage current, $I_{off}$) of the semiconductor device with the π-shaped semiconductor conductive layer according to the present invention when the drain bias is 1.0 V. Curves L191 and L192 respectively represent the relation curves of the on current when a gate voltage relative to the substrate voltage is 1.0 V vs. the off current when the gate voltage relative to the source voltage is 0.0 V of the semiconductor device with the π-shaped semiconductor conductive layer according to the present invention and the conventional UTSOI transistor when the main body voltage is 0.0 V. Curves L193 and L194 respectively represent the relation curves of the on current when the gate voltage relative to the substrate voltage is 1.0 V vs. the off current when the gate voltage relative to the substrate voltage is 0.0 V of the semiconductor device with the π-shaped semiconductor conductive layer according to the present invention and the conventional UTSOI transistor when the main body voltage is −2.0 V. It can be seen from FIG. 19 that under the same drain bias, the same main body voltage, and the same gate voltage, the semiconductor device with the π-shaped semiconductor conductive layer according to the present invention has a higher on current, so it is easily driven.

Figure 20:
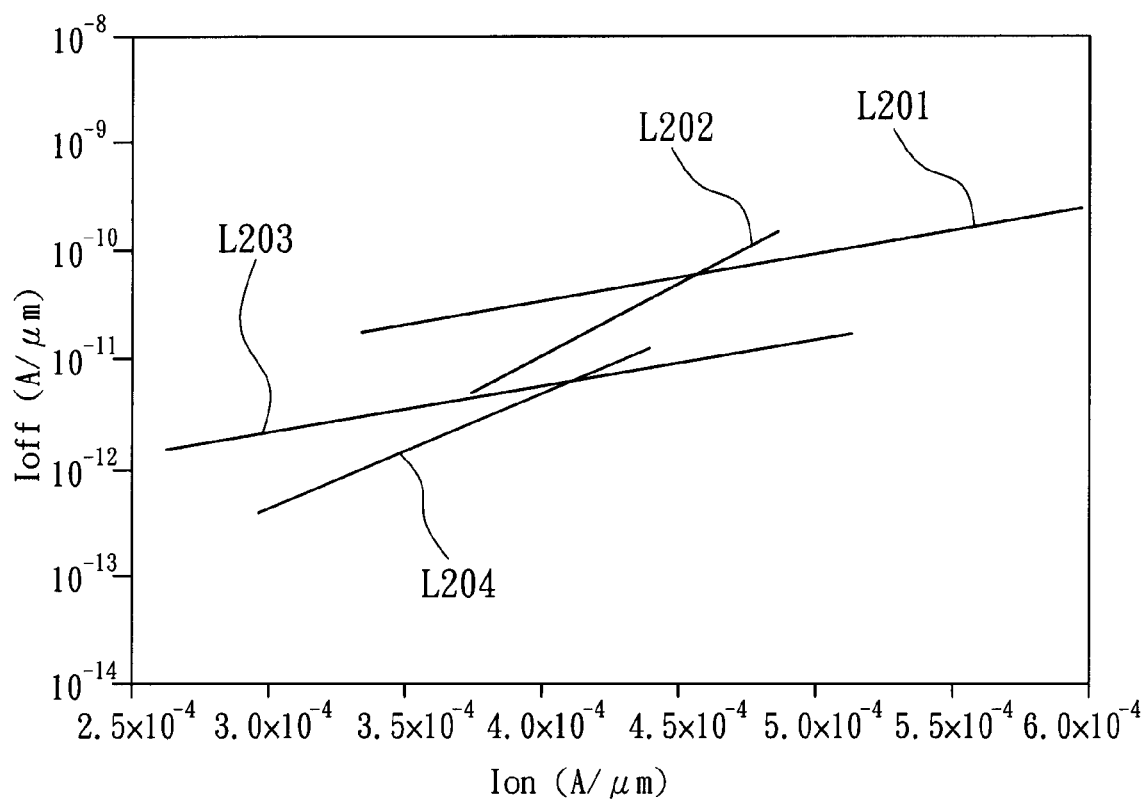

FIG. 20 is a relation diagram of the on current ($I_{on}$) vs. the off current ($I_{off}$) of the semiconductor device with the π-shaped semiconductor conductive layer according to the present invention when the drain bias is 1.0 V. Curves L201 and L202 respectively represent the relation curves of the on current when the gate overdrive voltage ($V_{Gs}-V_{Th}$) is 1.0 V vs. the off current when the gate voltage relative to the substrate voltage is 0.0 V of the semiconductor device with the π-shaped semiconductor conductive layer according to the present invention and the conventional UTSOI transistor when the main body voltage is 0.0 V. Curves L203 and L204 respectively represent the relation curves of the on current when the gate overdrive voltage is 1.0 V vs. the off current when the gate voltage relative to the source voltage is 0.0 V of the semiconductor device with the π-shaped semiconductor conductive layer according to the present invention and the conventional UTSOI transistor when the main body voltage is −2.0 V. It can be seen from FIG. 20 that under the same drain bias, the same main body voltage, and the same gate voltage, the semiconductor device with the π-shaped semiconductor conductive layer according to the present invention has a higher on current, so it is easily driven.

Figure 21:
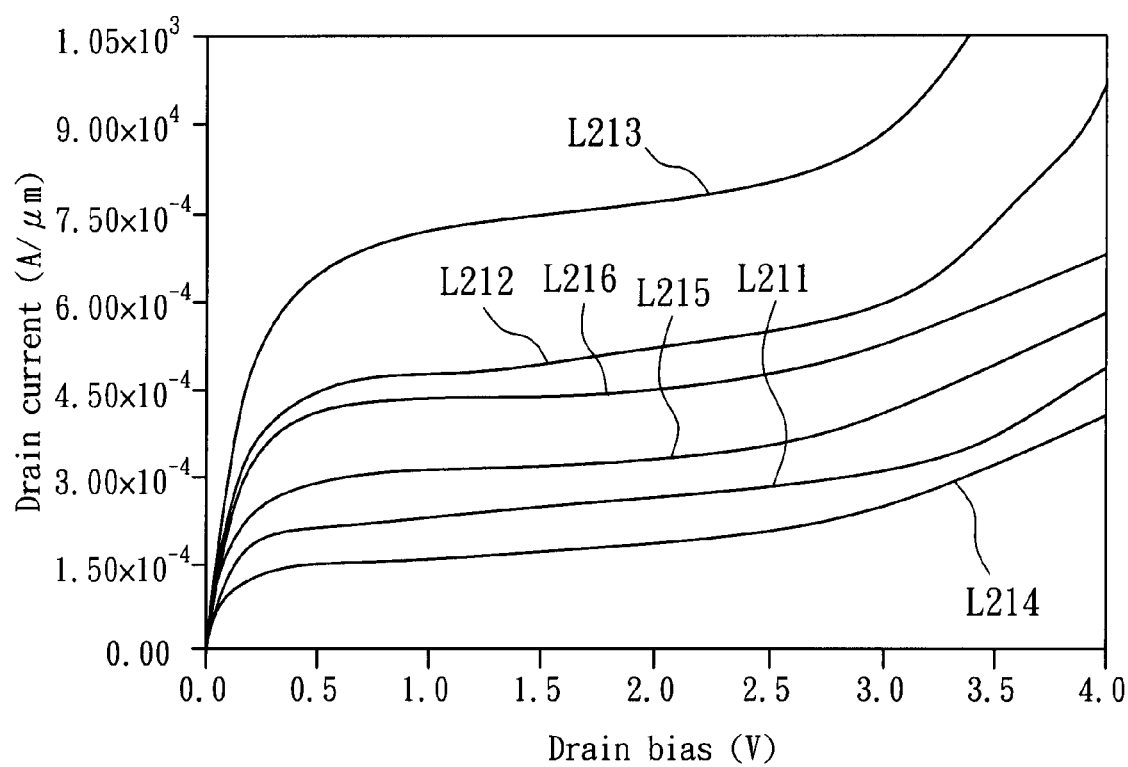
FIGS. 21 and 22 are relation diagrams of the drain bias vs. the drain current of the semiconductor device with the π-shaped semiconductor conductive layer according to the present invention and of the conventional UTSOI transistor.

FIG. 21 is a relation diagram of the drain bias vs. a drain current of the semiconductor device with the π-shaped semiconductor conductive layer according to the present invention and the conventional UTSOI transistor. Curves L211, L212, and L213 respectively represent the relation curves of the drain bias vs. the drain current of the semiconductor device with the π-shaped semiconductor conductive layer according to the present invention when the gate overdrive voltage ($V_{Gs}-V_{Th}$) is 0.2 V, 0.4 V, and 0.6 V, and curves L214, L215, and L216 respectively represent the relation curves of the drain bias vs. the drain current of the conventional UTSOI transistor when the gate overdrive voltage is 0.2 V, 0.4 V, and 0.6 V.

Figure 22:
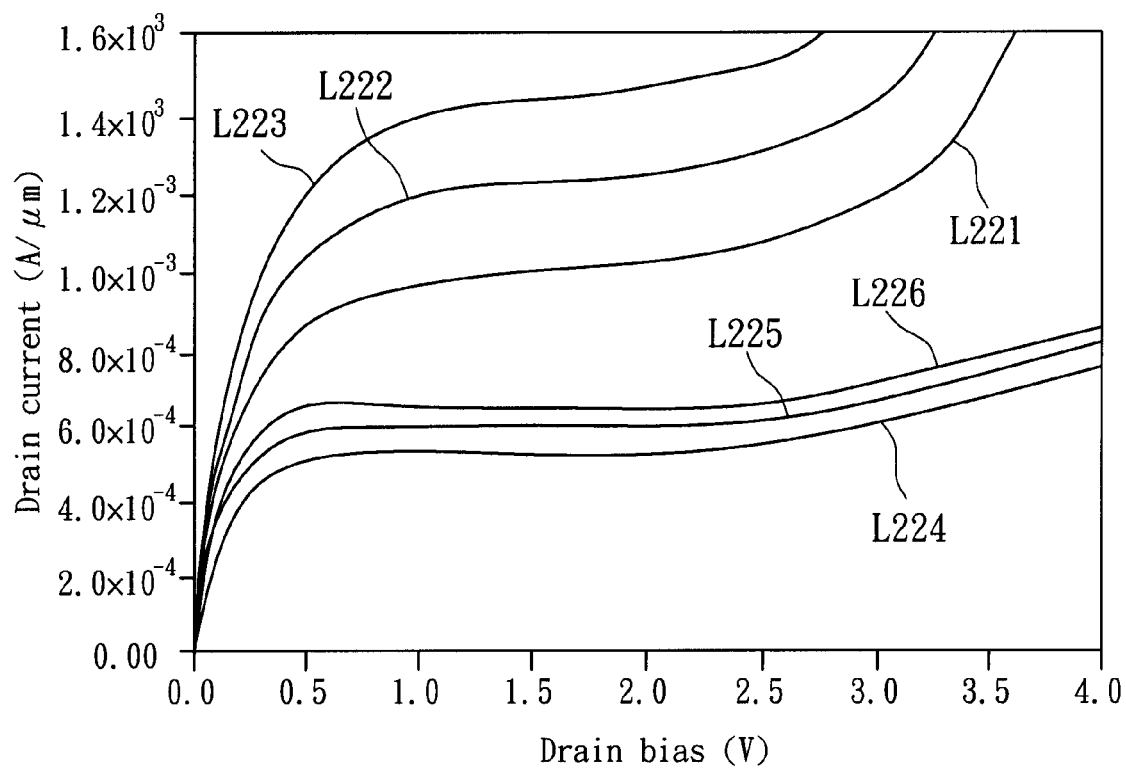

FIG. 22 is a relation diagram of the drain bias vs. the drain current of the semiconductor device with the π-shaped semiconductor conductive layer according to the present invention and the conventional UTSOI transistor. Curves L221, L222, and L223 respectively represent the relation curves of the drain bias vs. the drain current of the semiconductor device with the π-shaped semiconductor conductive layer according to the present invention when the gate overdrive voltage is 0.8 V, 1.0 V, and 1.2 V, and curves L224, L225, and L226 respectively represent the relation curves of the drain bias vs. the drain current of the conventional UTSOI transistor when the gate overdrive voltage is 0.8 V, 1.0 V, and 1.2 V.

It can be seen from FIGS. 21 and 22 that under the same gate overdrive voltage and the same drain bias, the semiconductor device with the π-shaped semiconductor conductive layer according to the present invention has a higher drain current; the reason is that the π-shaped semiconductor conductive layer according to the present invention provides two heat dissipation pathways connected to the first silicon layer, so as to reduce the SHE of the semiconductor device. When the gate overdrive voltage is increased to 1.2 V, the SHEs will damage the performance of the conventional UTSOI transistor.

Figure 23:
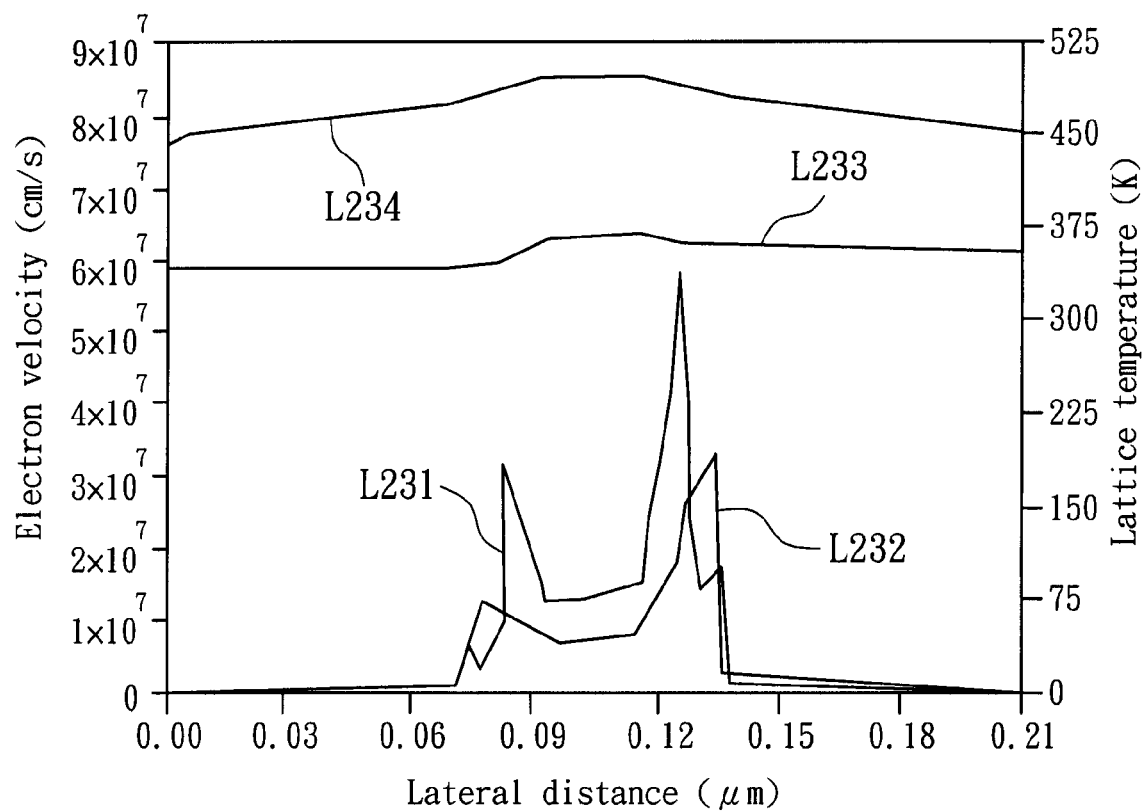
FIG. 23 is a relation diagram of a semiconductor device lateral distance vs. the electron velocity and the semiconductor device lateral distance vs. the lattice temperature of the semiconductor device with the π-shaped semiconductor conductive layer according to the present invention and of the conventional UTSOI transistor.

FIG. 23 is a relation diagram of a semiconductor device lateral distance vs. an electron velocity and the semiconductor device lateral distance vs. a lattice temperature of the semiconductor device with the π-shaped semiconductor conductive layer according to the present invention and the conventional UTSOI transistor, in which the semiconductor device lateral distance represents the lateral distance from the source to the drain. Curves L231 and L232 respectively represent the relation curves of the semiconductor device lateral distance vs. the electron velocity of the semiconductor device with the π-shaped semiconductor conductive layer according to the present invention and the conventional UTSOI transistor when the drain bias is 4.0 V and the gate overdrive voltage is 1.0 V. Curves L233 and L234 respectively represent the relation curves of the semiconductor device lateral distance vs. the lattice temperature of the semiconductor device with the π-shaped semiconductor conductive layer according to the present invention and the conventional UTSOI transistor when the drain bias is 4.0 V and the gate overdrive voltage is 1.0 V. It can be seen from FIG. 23 that under the same drain bias and the same gate voltage relative to the threshold voltage, the semiconductor device with the π-shaped semiconductor conductive layer according to the present invention has a higher electron velocity and a lower lattice temperature.

Figure 24:
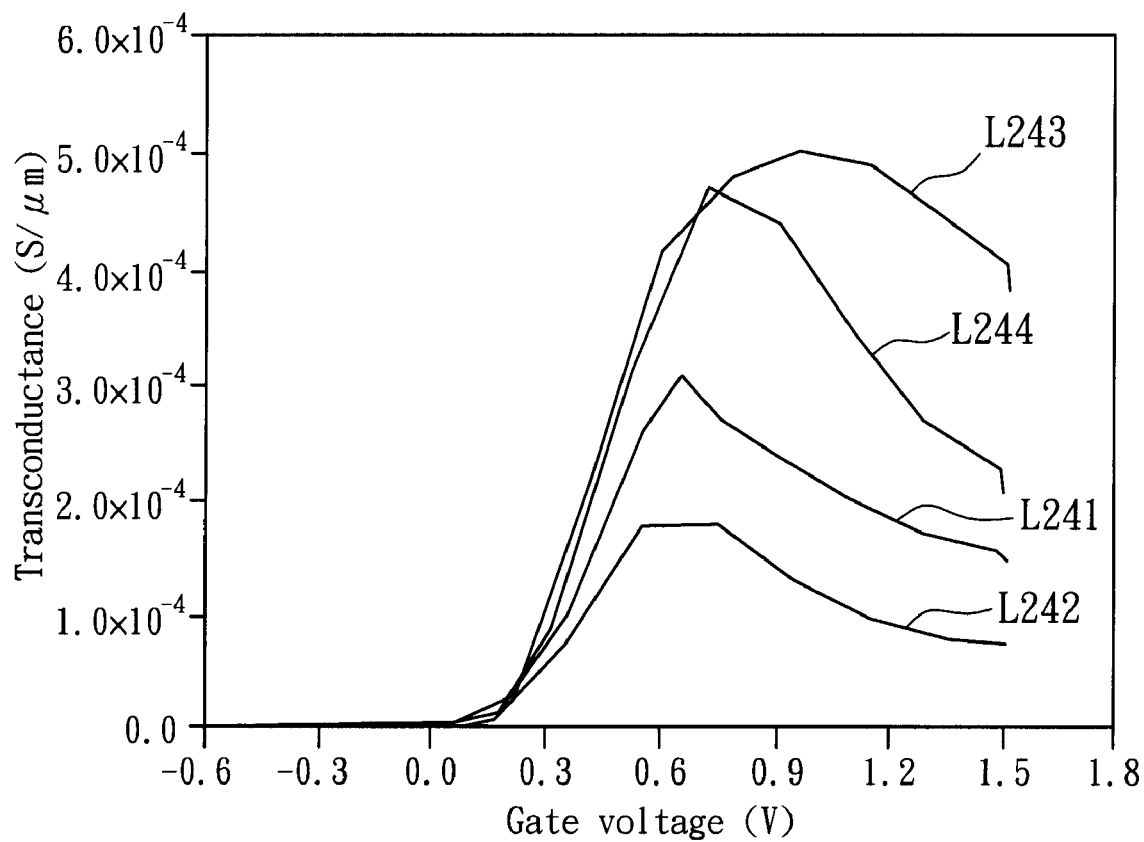
FIG. 24 is a relation diagram of a gate voltage vs. the transconductance of the semiconductor device with the π-shaped semiconductor conductive layer according to the present invention and of the conventional UTSOI transistor.

FIG. 24 is a relation diagram of the gate voltage vs. a transconductance of the semiconductor device with the π-shaped semiconductor conductive layer according to the present invention and the conventional UTSOI transistor. Curves L241 and L242 respectively represent the relation curves of the gate voltage relative to the source voltage vs. the transconductance of the semiconductor device with the π-shaped semiconductor conductive layer according to the present invention and the conventional UTSOI transistor when the drain bias is 0.05 V. Curves L243 and L244 respectively represent the relation curves of the gate voltage relative to the substrate voltage vs. the transconductance of the semiconductor device with the π-shaped semiconductor conductive layer according to the present invention and the conventional UTSOI transistor when the drain bias is 1.0 V. It can be seen from FIG. 24 that under the same drain bias, the semiconductor device with the π-shaped semiconductor conductive layer according to the present invention has a higher transconductance.

The present invention provides a non-conventional SOI MOSFET having a self-aligned technique, a high quality monocrystalline silicon channel layer (the first silicon layer 113), and a π-shaped conductive layer (the π-shaped semiconductor conductive layer 160). The structure and the technique of the semiconductor device of the present invention can definitely be applied to a thin film transistor in a photoelectric field.

The new process of the self-aligned technique of the present invention allows the construction of a self-aligned source/drain tie channel on the conventional UTSOI field effect transistor, and naturally connects the source/drain end point with higher temperature to the silicon substrate, so as to solve the serious self-heating problem of the conventional UTSOI, eliminate the unreliability resulting from the unstable heat, and to eliminate the FBEs resulting from a collision ionization and a second kink effect of a parasitic bipolar transistor, that is, a bipolar snap-breakdown may be delayed.

In addition, the semiconductor device of the present invention has the source/drain tie channel, so the source/drain series resistance and the tie channel resistance generate a parallel result; thus, the total effective source/drain series resistance is lowered, and a current driving force is increased. Particularly, the semiconductor device of the present invention greatly improves the heat reliability of the ultra-short-channel nano-element.

In order to overcome the short-channel effects, the ultrathin monocrystalline silicon thin film with the ultra uniform thickness must be utilized, but the conventional technique cannot be used for manufacture, and the conventional BULK MOS matching with the expensive ultra shallow junction depth technique cannot solve the problem. At the same time, the gate engineering must be integrally formed with the main body; otherwise, the alignment problem will result in serious performance degradation and serious electrical variation, and the system design and the timing control will also become difficult. Therefore, the self-aligned technique and the CMP of a shallow trench isolation (STI) technique of the present invention are quite helpful for the manufacture of nano-element, particularly for an element under 10 nanometers.

The semiconductor device of the present invention is a brand new UTSOI with good compact capability and extremely high flexibility in terms of expansion and modification of the element performance. For example, the elevated source/drain may be easily achieved, as long as the wet etching process for forming the source/drain is controlled in advance, and thus the current driving force is naturally increased. In addition, interference of impurity concentration variability on the element performance is wholly eliminated by utilizing the undoped intrinsic main body channel (the first silicon layer 113), and an optimal threshold voltage ($V_{TH}$) is designed to match a gate engineering. It is also possible to form the source/drain having the compression stress on the channel by utilizing other materials, for example, SiGe, SiC, or silicified metals, so as to enhance the carrier mobility in the monocrystalline channel and the current driving force of the element or to enhance the element performance.

The semiconductor device with the π-shaped semiconductor conductive layer manufactured by the manufacturing method thereof of the present invention has two heat dissipation pathways connected to the first silicon layer, thereby reducing the SHEs of the semiconductor device. Furthermore, the semiconductor device with the π-shaped semiconductor conductive layer utilizes the self-aligned technique to generate the self-aligned structure with the gate and the silicon main body (the first silicon layer), so the process is simple, the cost is reduced, the element compacted ability, the yield is improved, the off current, and the SCEs are still maintained at desired level, and the stability and the reliability are therefore superior.

Further, it can be seen from FIGS. 15 to 24 that in addition to relatively desired threshold voltage roll-off phenomenon and reduce DIBL effect, the semiconductor device with the π-shaped semiconductor conductive layer of the present invention has lower resistance from the source to the drain, higher on current, higher electron velocity, lower lattice temperature, and higher transconductance, so that the performance on the whole is superior than the performance of the conventional MOSFET.

While the embodiments of the present invention have been illustrated and described, various modifications and improvements can be made by those skilled in the art. The embodiments of the present invention are therefore described in an illustrative but not restrictive sense. It is intended that the present invention will not be limited to the particular forms as illustrated, and that all modifications that maintain the spirit and scope of the present invention are within the scope as defined in the appended claims.

What is claimed is:

1. A semiconductor device with a π-shaped semiconductor conductive layer, comprising:
    a silicon-on-insulator (SOI) substrate, having a silicon substrate, a first insulating barrier layer, and a first silicon layer, wherein the first insulating barrier layer is located on the silicon substrate, and the first silicon layer is located on the first insulating barrier layer;
    a gate unit, located on the first silicon layer;
    a spacing layer, covering the gate unit;
    a second silicon layer, covering the silicon substrate and two opposite sides of the first insulating barrier layer and the first silicon layer;
    a second insulating barrier layer, located directly on the second silicon layer and spaced by the second silicon layer to be located at opposite positions on the two opposite lateral edges of the first insulating barrier layer; and
    a source and a drain, located directly on the second insulating barrier layer, and connected to the first silicon layer through the second silicon layer, wherein the source, the drain, the first silicon layer, and the second silicon layer form the π-shaped semiconductor conductive layer, wherein the π-shaped semiconductor conductive layer comprises two vertical members extending normal to an active surface and separated from each other, with a horizontal member extending between the tops of the two vertical members.

2. The semiconductor device according to claim 1, wherein the first silicon layer is a monocrystalline silicon layer.

3. The semiconductor device according to claim 1, wherein the second silicon layer is a polycrystalline silicon layer.

4. The semiconductor device according to claim 1, wherein the gate unit sequentially comprises a gate oxide layer and a gate, and the gate oxide layer is formed on the first silicon layer.

5. The semiconductor device according to claim 4, wherein the gate is of a metal material.

6. The semiconductor device according to claim 4, wherein the gate is of a polycrystalline silicon material.

7. The semiconductor device according to claim 4, wherein the gate oxide layer is selected from silicon dioxide, SiN, oxygen-nitrogen-oxygen, high dielectric coefficient material, or any combination thereof.

8. The semiconductor device according to claim 1, wherein the spacing layer is a silicon nitride (SiN) layer.

9. The semiconductor device according to claim 1, wherein a height of the second insulating barrier layer is substantially equal to a height of the first insulating barrier layer.

10. The semiconductor device according to claim 1, wherein a height of the second insulating barrier layer is substantially smaller than a height of the first insulating barrier layer.

11. The semiconductor device according to claim 1, further comprising a spacer formed between the source and the spacing layer, and between the drain and the spacing layer.

* * * * *